United States Patent [19]

Noro

[11] Patent Number: 4,803,441
[45] Date of Patent: Feb. 7, 1989

[54] AMPLIFYING CIRCUIT

[75] Inventor: Masao Noro, Hamamatsu, Japan

[73] Assignee: Yamaha Corporation, Hamamatsu, Japan

[21] Appl. No.: 24,028

[22] Filed: Mar. 10, 1987

[30] Foreign Application Priority Data

Mar. 14, 1986 [JP] Japan .................................. 61-56631

[51] Int. Cl.$^4$ ............................................... H03F 3/30
[52] U.S. Cl. ..................................... 330/257; 330/268
[58] Field of Search ............... 330/255, 257, 260, 267, 330/268, 288; 323/315, 316

[56] References Cited

U.S. PATENT DOCUMENTS 4,404,528 9/1983 Yamaguchi .......................... 330/288

FOREIGN PATENT DOCUMENTS 54-17544 6/1979 Japan .
108808 6/1983 Japan .................................. 330/268

Primary Examiner—James B. Mullins
Attorney, Agent, or Firm—Spensley Horn Jubas & Lubitz

[57] ABSTRACT

An amplifying circuit comprises a voltage-current converter for voltage-current converting an input signal to be amplified and a current-current converter including a first transistor (NPN), a second transistor (NPN), a third transistor (PNP) and a fourth transistor (PNP). Emitters of the first and third transistors are connected to each other, collector and base of the second transistor are connected to each other, collector and base of the fourth transistor are connected to each other, emitters of the second and fourth transistors are connected to each other, bases of the first and second transistors are connected to each other and bases of the third and fourth transistors are connected to each other. Output current of the voltage-current converter is supplied to the emitters of the first and third transistors and a constant current is supplied to the second and fourth transistors. The amplifying circuit further comprises an output circuit which synthesizes and outputs collector currents of the first and third transistors after amplifying these collector currents and a circuit for negative-feeding back an output of the output circuit to the voltage-current converter. An amplifying circuit with reduced idling current and an expended range of class-A operation is provided.

5 Claims, 4 Drawing Sheets

AMPLIFYING CIRCUIT

BACKGROUND OF THE INVENTION

This invention relates to an amplifying circuit with reduced idling current and expanded range of class-A operation.

In the prior art class-A amplifier, base bias is determined at such a value that operating current (collector current flowing when no signal is being applied) becomes one half of peak current (i.e., the middle point of the operating curve) so that amplifying elements are constantly kept in an active state both in positive and negative cycles of an input signal and linearity in amplification thereby is ensured. FIG. 1 shows a prior art class-A push-pull amplifier as an example of such class-A amplifier. In this amplifier, large base biases E1 and E2 are applied to transistors 10 and 12 of the push-pull construction.

Input-output characteristics of the class-A push-pull amplifier of FIG. 1 are shown in FIG. 2. The characteristics show that, owing to the application of the base biases E1 and E2 to the transistors 10 and 12, the transistors 10 and 12 are not cut off with resulting reduction in distortion.

The prior art class-A amplifier however is disadvantageous in that it requires a relatively large idling current and that the range in which it can perform the class-A operation is limited to a relatively narrow range and, if an input of a level exceeding this range is applied to the amplifier, one of the trasistors is cut off with resulting generation of distortion.

It is, therefore, an object of the invention to provide an amplifying circuit with reduced idling current and an expanded range of class-A operation.

SUMMARY OF THE INVENTION

For achieving the above described object of the invention, the amplifying circuit according to the invention is characterized in that it comprises a voltage-current conversion circuit for voltage-current converting an input signal to be amplified, a current-current conversion circuit comprising a first transistor (NPN), a second transistor (NPN), a third transistor (PNP) and a fourth transistor (PNP), emitters of the first and third transistors being connected to each other, collector and base of the second transistor being connected to each other, collector and base of the fourth transistor being connected to each other, emitters of the second and fourth transistors being connected to each other, bases of the first and second transistors being connected to each other, bases of the third and fourth transistors being connected to each other, output current of the voltage-current conversion circuit being supplied to the common emitter of the first and third transistors and a constant current being supplied to the second and fourth transistors, an output circuit for synthesizing and outputting collector currents of the first and third transistors after amplifying these collector currents, and a circuit for negative-feeding back an output of the output circuit to the voltage-current conversion circuit.

According to the invention, currents Ic1 and Ic3 ($Ix = Ic1 + Ic3$, $Ic1 \times Ic3$ being constant) flow constantly in one direction regardless of the direction of the output current Ix of the voltage-current converter so that no cut-off occurs in the amplifying stage which is operated by these currents and distortion due to switching of the direction can also be prevented. Accordingly, the amplifying circuit can perform class-A amplification over a wide range with a relatively small idling current so that an efficient amplifying circuit with reduced distortion in its output can be realized.

The invention will now be described with reference to the accompanying drawings.

BRIEF DESCRIPTION OF THE DRAWINGS

In the accompanying drawings.

DESCRIPTION OF A PREFERRED EMBODIMENT

Figure 1:
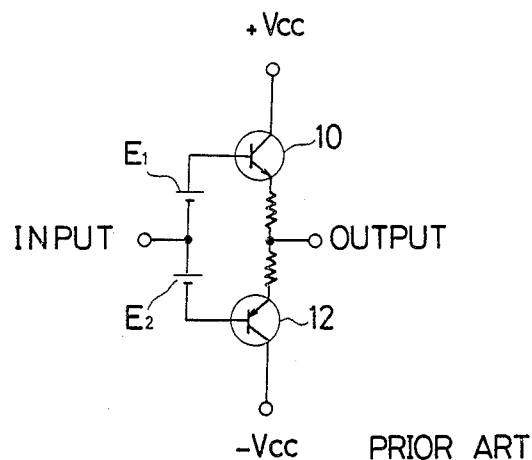
FIG. 1 is a circuit diagram showing the prior art class-A push-pull amplifier.
Figure 2:
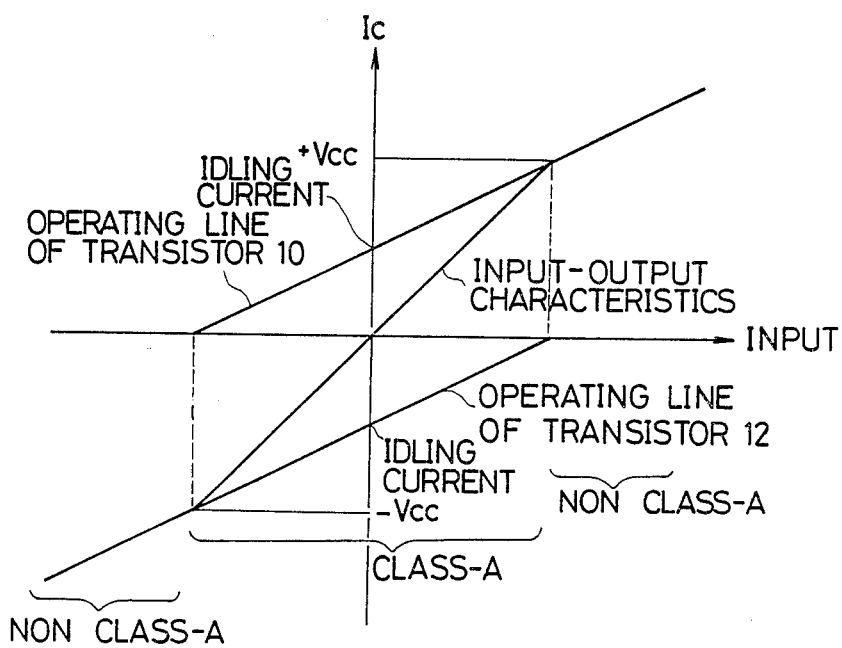
FIG. 2 is a characteristic diagram showing the operation of the circuit of FIG. 1.

A current-current conversion circuit used in the invention will first be described with reference to FIG. 4. This current-current conversion circuit comprises an NPN transistor Tr1 and a PNP transistor Tr3 whose emitters are connected to each other and an input signal is applied through the emitters of the transistors Tr1 and Tr3. The base of the transistor Tr1 is connected to the base of an NPN transistor Tr2. The base of the transistor Tr3 is connected to the base of a PNP transistor Tr4. The transistors Tr2 and Tr4 whose respective base and collector are connected to each other are connected with their emitters connected to each other. The emitters of the transistors Tr2 and Tr4 are connected to a reference voltage (ground voltage in this embodiment). A constant current is supplied respectively to the transistors Tr2 and Tr4.

In this circuit, reference characters Ic1 through Ic4 denote collector currents of the respective transistors Tr1 through Tr4. The collector currents Ic2 and Ic4 of the transistors Tr2 and Tr4 are constant currents whose value is both $I_d \cdot V_{BE1}$ through $V_{BE4}$ denote base-emitter voltages of the respective transistors Tr1 through Tr4. From characteristics of the respective transistors Tr1 through Tr4, the following equations can be derived (it is assumed that the magnitude of the current treated is larger than saturation current Iso in reverse direction in the PN connection):

$$V_{BE1} - V_{BE2} \approx K \cdot \log_e \frac{Ic1}{Ic2} \quad (1)$$

$$V_{BE3} - V_{BE4} \approx K \cdot \log_e \frac{Ic3}{Ic4} \quad (2)$$

From the circuit construction, $V_{BE1} - V_{BE2} = -V_{BE3} - V_{BE4}$ so that the following equation (3) is derived from the equations (1) and (2):

$$K \cdot \log_e \frac{Ic1}{Ic2} = -K \cdot \log_e \frac{Ic3}{Ic4} \quad (3)$$

-continued

Therefore, $$\log_e \frac{Ic1}{Ic2} = \log_e \frac{Ic3}{Ic4} = \log_e \frac{Ic1 \cdot Ic3}{Ic2 \cdot Ic4} = 0 \quad (4)$$

Since $Ic2 = I_D$ and $Ic4 = -I_D$, $$\log_e \frac{Ic1 \cdot Ic3}{Ic2 \cdot Ic4} = \log_e \frac{Ic1 \cdot Ic3}{-I_D^2} = 0 \quad (5)$$

Therefore, $$Ic1 \cdot Ic3 \approx -I_D^2 \quad (6)$$

If, therefore, $I_D^2 \neq 0$, neither of the current Ic1 and Ic3 flowing in the transistors Tr1 and Tr3 does not become zero even in a case where a current Ix is applied from outside to the emitters of these transistors Tr1 and Tr3 and one of the currents Ic1 and Ic3 becomes of a large value.

Figure 4:
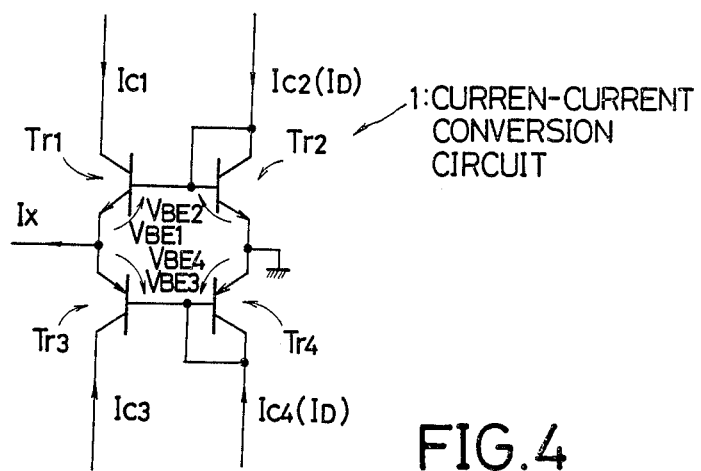
FIG. 4 is a circuit diagram showing a current-current conversion circuit employed in the ampliying circuit according to the invention.

The values of the currents Ic1 and Ic3 relative to the input current Ix can be obtained in the following manner:

From the circuit of FIG. 4, $$Ix = Ic1 + Ic3 \quad (7)$$

From the equation (6), $$Ic3 = \frac{-I_D^2}{Ic1} \quad (8)$$

From the equations (7) and (8), $$Ix = Ic1 + \frac{-I_D^2}{Ic1} \quad (9)$$

From the equation (9), $$Ic1^2 - Ix \cdot Ic1 - I_D^2 = 0 \quad (10)$$

Therefore, $$Ic1 = \frac{Ix \pm \sqrt{Ix^2 + 4I_D^2}}{2} \quad (11)$$

Among solutions of the equation (11), the following (12) is a true solution:

$$Ic1 = \frac{Ix + \sqrt{Ix^2 + 4I_D^2}}{2} \quad (12)$$

Similarly, the current Ic3 can be obtained as the following equation (13):

$$Ic3 = \frac{Ix - \sqrt{Ix^2 + 4I_D^2}}{2} \quad (13)$$

Figure 5:
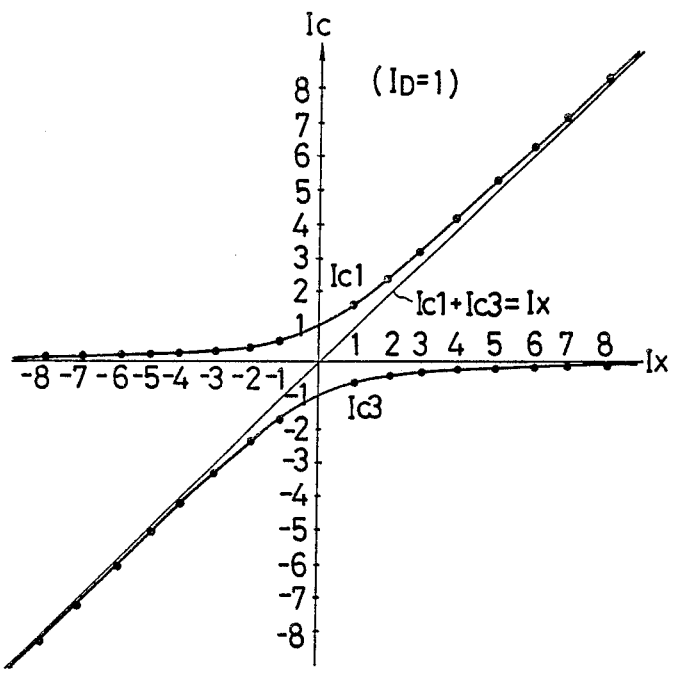
FIG. 5 is a characteristic diagram of the operation of the circuit of FIG. 4.

The values of Ic1 and Ic3 in the equations (12) and (13) against the input current Ix on the assumption that $I_D = 1$ are plotted as shown in FIG. 5.

It will be understood from FIG. 5 that even if one of the currents Ic1 and Ic3 increases to a large value due to increase in the input current Ix, the other does not cross the zero level. Besides, a sum of Ic1 and Ic3 becomes a straight line crossing the origin.

Summing up, the circuit of FIG. 4 has the following characteristics:

(1) The circuit converts the input current Ix to the output currents Ic1 and Ic3.

(2) The polarity of the output currents Ic1 and Ic3 is constant and never is reversed regardless of the polarity of the input current Ix.

(3) $Ix = Ic1 + Ic3$ (4) $Ic1 \times Ic3 = $ constant

Accordingly, by amplifying the output currents Ic1 and Ic3 individually and thereafter combining them together, elements constituting the amplifying stage can be maintained constantly in an active state, i.e., class-A operation.

Figure 6:
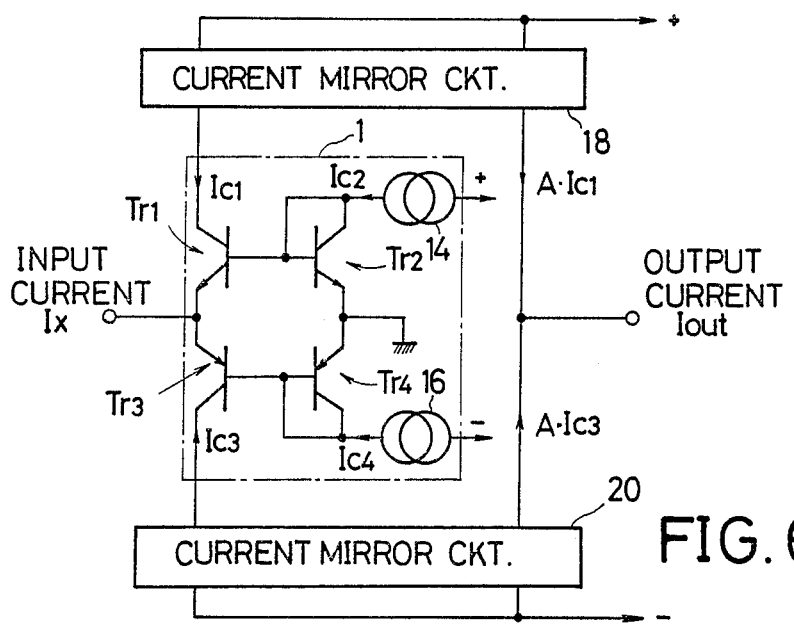
FIG. 6 is a circuit diagram showing a current amplifying circuit using the circuit of FIG. 4.

FIG. 6 shows an example of a current amplifying circuit using the current-current conversion circuit of FIG. 4. In this circuit, constant currents Ic2 and Ic4 are supplied to the transistors Tr2 and Tr4 by constant current circuits 14 and 16.

Current mirror circuits 18 and 20 amplify the output currents Ic1 and Ic3 of the current-current conversion circuit 1 by A times and deliver out the amplified output currents A·Ic1 and A·Ic3. These amplified output currents A·Ic1 and A·Ic3 are combined together and become $Iout = A \cdot Ic1 + A \cdot Ic3 = A \cdot (Ic1 + Ic3) = A \cdot Ix$. That is, the input current is amplified by A times and provided as the output current. Since Ic1 and Ic3 are currents of a constant direction, the currents A·Ic1 and A·Ic3 are also currents of a constant direction so that the current mirror circuits 18 and 20 can completely perform class-A operation. The current mirror circuits 18 and 20 therefore are not cut off and class-A operation can be obtained within a relatively wide range with a small idling current.

Figure 3:
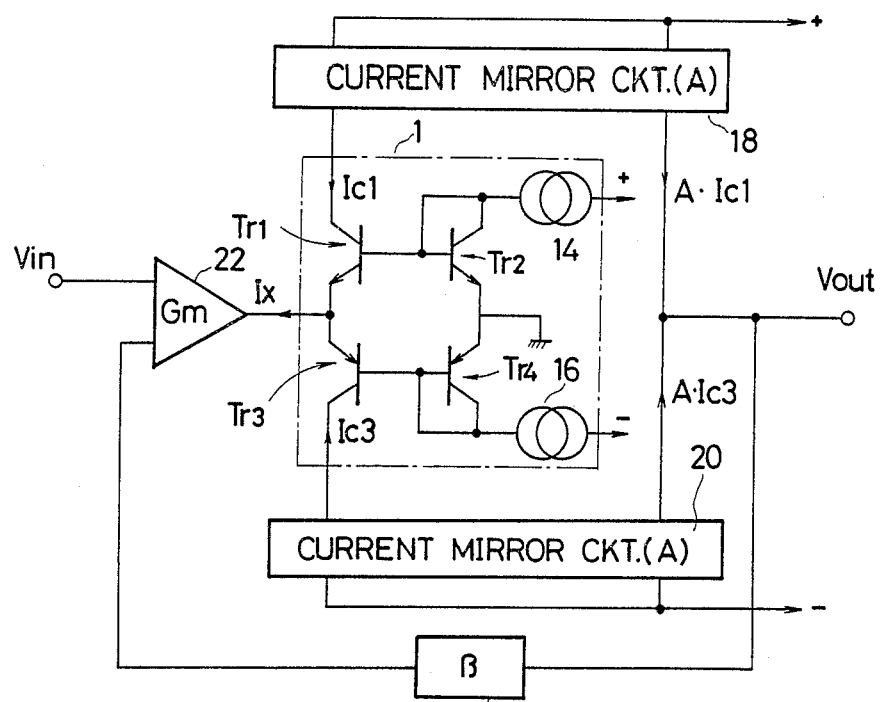
FIG. 3 is a circuit diagram showing an embodiment of the invention.

FIG. 3 shows an embodiment of the invention in which a power amplifier is constructed by using the current amplifying circuit of FIG. 6. An amplifier 22 constitutes a voltage-current conversion circuit which receives an input voltage Vin and outputs a current Ix wherein is $Ix = Gm \cdot Vin$. The current Ix is divided into currents Ic1 and Ic3 in the current-current conversion circuit 1 ($Ix = Ic1 + Ic3$) and the currents Ic1 and Ic3 are amplified by A times by the current mirror circuits 18 and 20 and thereafter combined together and outputted. The output signal Vout is fed back to the input of an amplifier 22 through a feedback circuit 24. In this circuit, output impedance becomes $1/Gm \cdot A [\Omega]$ and voltage gain becomes $1/\beta$.

Figure 7:
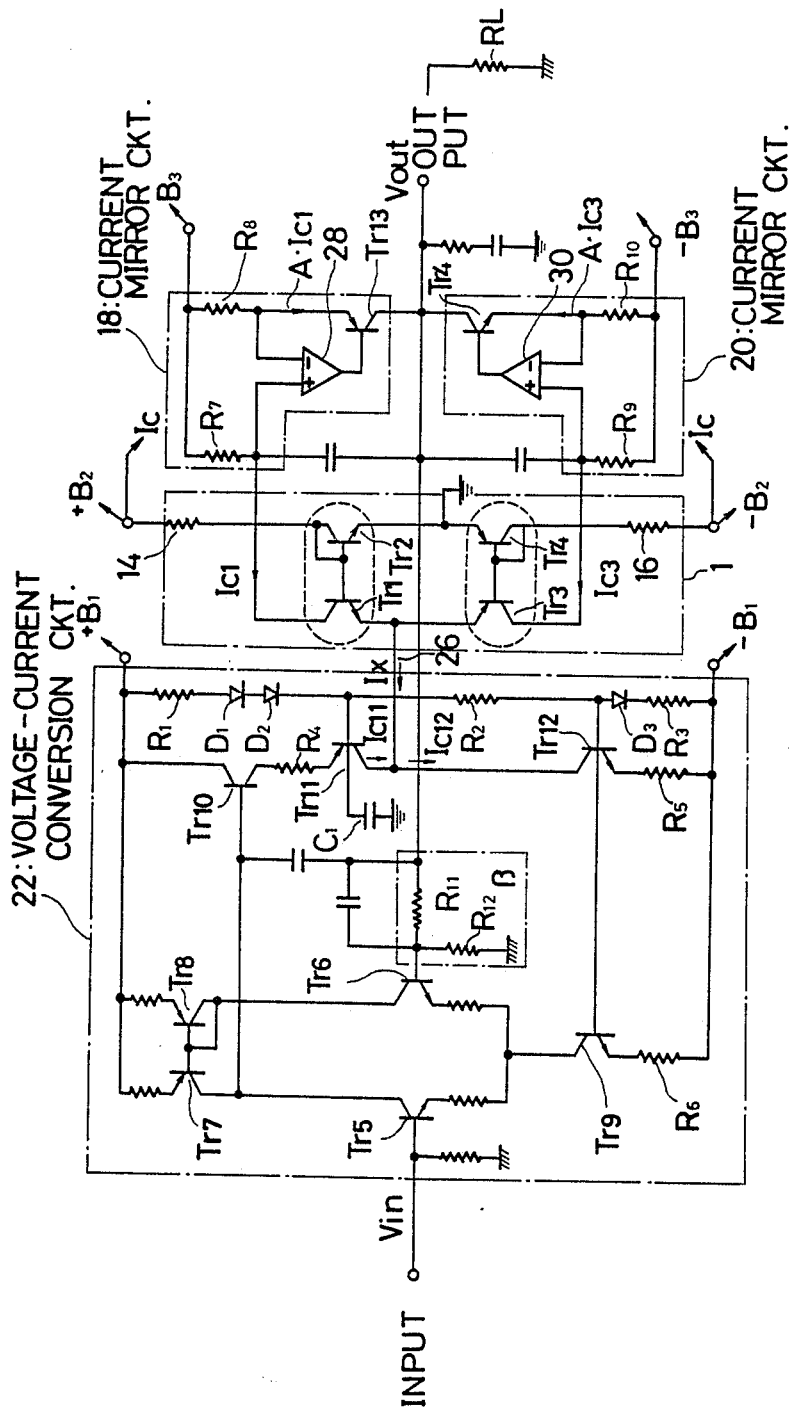
FIG. 7 is a circuit diagram showing a specific example of the circuit of FIG. 3.

FIG. 7 shows a specific circuit of the embodiment of FIG. 3.

The input signal (voltage) Vin is applied to a voltage-current conversion circuit 22. The voltage-current conversion circuit 22 comprises transistors Tr5, Tr6 which constitute a differential amplifier. A transistor Tr 9 and resistor R6 constitute a constant current circuit of this differential amplifier and generates a constant current determined by voltage across a diode D3 and resistor R3. To the differential amplifier is connected a current mirror circuit composed of transistors Tr7 and Tr8. The input signal Vin is applied to the base of the transistor Tr5 and the collector output of this transistor Tr5 is applied to the base of a transistor Tr10. Accordingly, when the input signal Vin is large, the base potential of the transistor Tr10 drops whereas when the input signal Vin is small, the base potential of the transistor Tr10 rises.

The transistor Tr10, resistor R4, transistors Tr11 and Tr12 and resistor R5 are connected in series between a power sources +B1 and −B1. The voltage between the power sources +B1 and −B1 is divided by resistor R1, diodes D1 and D2, resistor R2, diode D3 and resistor R3. The base of the transistor Tr11 is connected between the diode D2 and the resistor R2 and is also grounded through a capacitor C1. Accordingly voltage across the resistor R1 and the diodes D1 and D2 is applied between the collector of the transisitor Tr10 and the base of the transistor 11. Accordingly, as the base potential of the transistor Tr10 rises, the current flowing through the transistor Tr10, resistor R4 and transistor Tr11 increases whereas as the base potential of the transistor Tr10 drops, this current decreases. The collector of the transistor Tr11 is connected to a current-current conversion circuit 1 of a next stage via a line 26.

The transistor Tr12 and resistor R5 constitute a constant current circuit which generates a constant current determined by voltage across the diode D3 and the resistance R3. Accordingly, current Ix which is difference between collector current Ic11 of the transistor Tr11 and collector current Ic12 of the transistor Tr12 flows in the line 26.

Accordingly, the following current Ix is provided by the voltage-current conversion circuit 22 in accordance with the input Vin:

(1) When Vin=0,

Ic11 becomes equal to Ic12 so that $Ix = Ic11 − Ic12 = 0$.

(2) When Vin<0,

The collector potential of the transistor Tr5 (i.e., the base potential of the transistor Tr10) rises and Ic11 becomes larger than Ic12 so that difference current Ic11−Ic12 flows in the direction to the current-current conversion circuit 1 as the current Ix.

(3) When Vin>0,

The collector potential of the transistor Tr5 drops so that Ic11<Ic12 and difference current Ic12−Ic11 flows from the current-current conversion circuit 1 as the current Ix.

In this manner, the current Ix proportionate to the input Vin flows and the voltage-current conversion thereby is performed.

The output current Ix on the line 26 is applied to the current-current conversion circuit 1 to control the values of the currents Ic1 and Ic3 to satisfy the following relationships:

$$Ix = Ic1 + Ic3$$

$Ic1 \times Ic3 = K$ (wherein K is constant)

A current mirror circuit 18 controls the transistor Tr13 so that voltages across resistors R7 and R8 (respective values R7 and R8) in a differential amplifier 28 become equal to each other. Since the current Ic1 flows through the resistor R7 connected to a + input of the differential amplifier 28, a voltage drop of R7·Ic1 is produced across the resistor R7. Accordingly, current $$Ic1 \cdot \frac{R8}{R7}$$

flows through a resistor R8 connected to a − input of the differential amplifier 28 so that the voltage drop in the resistor R8 becomes equal to the voltage drop in the resistor R7. Accordingly, current amplification factor A of the current mirror circuit 18 becomes $A = R8/R7$.

The current mirror circuit 20 likewise controls a transistor Tr14 so that voltages at both inputs of a differential amplifier 30 become equal to each other. Since current Ic3 flows through a resistor R9 ( value R9=R7) connected to a + input of the differential amplifier 30, a voltage drop of R9·Ic3 is produced across the resistor R9. Accordingly, a current $$Ic3 \cdot \frac{R10}{R9}$$

flows through a resistor R10 ( value R10=R8) connected to a − input of the differential amplifier 30 so that the voltage drop in the resistor R10 becomes equal to the voltage drop in the resistor R9. Accordingly, current amplification factor A of the current mirror circuit 20 becomes $A = R10/R9 = R8/R7$.

In the foregoing manner, the collector currents A·Ic1 and A·Ic3 flow through the transistors Tr13 and Tr14 and a voltage corresponding to current which is difference between these collector currents is derived from a junction of the transistors Tr13 and Tr14 as the output Vout and is supplied to a load RL. The output Vout is negative-fed back to the base of the transistor Tr6 through resistors R11 and R12 (respective values R11 and R12).

According to the circuit of FIG. 7, the currents Ic1 and Ic3 do not become zero so that the currents A·Ic1 and A·Ic3 do not become zero either and, accordingly, the transistors Tr13 and Tr14 are not cut off but maintain class-A operation.

Since $Vin \cdot Gm \cdot A \cdot RL = V_0$, open loop gain $A_0$ of the circuit in FIG. 7 becomes $A_0 = Gm \cdot A \cdot RL > 0$ Where $Gm = I_0/Vin$ By applying negative feedback, an actual gain G becomes $$G = \frac{A_0}{1 + A_0\beta}$$

Where $\beta = \frac{R12}{R11 + R12}$

Since A>>0, the actual gain G becomes $$G = \frac{1}{\beta} = \frac{R11}{R12} + 1$$

What is claimed is:

1. An amplifying circuit comprising:
a voltage-current conversion circuit for voltage-current converting an input signal to be amplified;
a current-current conversion circuit comprising a first transistor, a second transistor, a third transistor and a fourth transistor, emitters of said first and third transistors being connected to each other, collector and base of said second transistor being connected to each other, collector and base of said fourth transistor being connected to each other, emitters of said second and fourth transistors being connected to each other, bases of said first and second transistors being connected to each other, bases of said third and fourth transistors being connected to each other, output current of said voltage-current conversion circuit being supplied to the emitters of said first and third transistors and a constant current being supplied to said second and fourth transistors;

an output circuit for synthesizing and outputting collector currents of said first and third transistors after amplifying these collector currents, wherein said output circuit comprises (a) a first current mirror circuit for providing a first output current which is a predetermined multiple of an output current of the first transistor, said first current mirror circuit including first control means having first and second resistors whose resistance ratio determines the predetermined multiple, (b) a second current mirror circuit for providing a second output current which is a predetermined multiple of an output current of the third transistor, said second current mirror circuit including second control means having third and fourth resistors whose resistance ratio determines the predetermined multiple for the second current mirror circuit, and (c) means for combining the first and second output currents to produce a composite output; and a circuit for negative-feeding back an output of said output circuit to said voltage-current conversion circuit;

wherein (a) the first current mirror circuit includes a first output transistor, a first differential amplifier driving a base of the first output transistor and having a first input coupled to one terminal of the first resistor and the collector of the first transistor and a second input coupled to one terminal of the second resistor, the other terminals of the resistors being connected to a supply voltage, and (b) the second current mirror circuit comprises a second output transistor, a second differential amplifier driving base of the second output transistor and having a first input coupled to one terminal of the third resistor and the collector of the third transistor and a second input coupled to one terminal of the fourth resistor, the other terminals of the resistors being connected to a supply voltage.

2. An amplifying circuit as defined in claim 1 wherein a point at which the emitters of said second and fourth transistors are connected to each other is connected to a certain potential.

3. An amplifying circuit as defined in claim 2 wherein current supplied to the emitters of said first and third transistors is a sum of collector currents of said first and third transistors.

4. An amplifying circuit as defined in claim 3 wherein values of the constant current supplied to said second and fourth transistors are equal to each other and set to a value other than zero.

5. An amplifying circuit as in claim 1 wherein the ratios of the first and second resistors and the third and fourth resistors are the same.

* * * * *